US010986743B2

(12) United States Patent
Lee

(10) Patent No.: US 10,986,743 B2
(45) Date of Patent: Apr. 20, 2021

(54) EXPANSION CARD INTERFACE FOR HIGH-FREQUENCY SIGNALS

(71) Applicant: Quanta Computer Inc., Taoyuan (TW)

(72) Inventor: Cheng-Hsien Lee, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 0 days.

(21) Appl. No.: 16/704,635

(22) Filed: Dec. 5, 2019

(65) Prior Publication Data
US 2020/0275566 A1 Aug. 27, 2020

Related U.S. Application Data

(60) Provisional application No. 62/811,263, filed on Feb. 27, 2019.

(51) Int. Cl.
H05K 5/02 (2006.01)
H05K 1/02 (2006.01)
H05K 1/14 (2006.01)
H05K 5/00 (2006.01)

(52) U.S. Cl.
CPC ........... H05K 5/026 (2013.01); H05K 1/0237 (2013.01); H05K 1/141 (2013.01); H05K 5/0069 (2013.01); H05K 2201/048 (2013.01)

(58) Field of Classification Search
CPC ..................................................... H05K 5/026
USPC .......................................................... 174/251
See application file for complete search history.

(56) References Cited

U.S. PATENT DOCUMENTS

| 5,210,855 | A | 5/1993 | Bartol |
| 5,567,295 | A | 10/1996 | Swamy et al. |
| 6,908,038 | B1* | 6/2005 | Le ................ G06K 19/077 235/492 |
| 2006/0042821 | A1 | 3/2006 | Pax |
| 2013/0183839 | A1 | 7/2013 | Seok et al. |
| 2017/0181283 | A1* | 6/2017 | Zhao ................ H05K 1/117 |

FOREIGN PATENT DOCUMENTS

| EP | 3402002 A1 | 11/2018 |
| TW | 200826696 A | 6/2008 |
| WO | 2014205902 A1 | 12/2014 |

OTHER PUBLICATIONS

Extended European Search Report for EP Application No. 20153046.6, dated Jul. 16, 2020.
TW Office Action for Application No. 109101057, dated Aug. 10, 2020, w/ First Office Action Summary.
TW Search Report for Application No. 109101057, dated Aug. 10, 2020, w/ First Office Action.

* cited by examiner

Primary Examiner — Stanley Tso
(74) Attorney, Agent, or Firm — Nixon Peabody LLP

(57) ABSTRACT

The present disclosure describes an expansion card interface for a printed circuit board. The expansion card interface includes a substrate having an edge. The expansion card interface further includes a plurality of signal pins configured to communicate one or more signals to and from the printed circuit board. The expansion card interface further includes a plurality of ground pins adjacent to the plurality of signal pins configured to provide a ground. At least one signal pin of the plurality of signal pins extends closer to the edge of the substrate than at least one ground pin of the plurality of ground pins.

6 Claims, 5 Drawing Sheets

EXPANSION CARD INTERFACE FOR HIGH-FREQUENCY SIGNALS

CROSS-REFERENCE TO RELATED APPLICATION

This application claims priority under 35 U.S.C. § 119 to U.S. Provisional Application No. 62/811,263, entitled "IMPROVED GOLDEN FINGER STRUCTURE FOR HIGH SPEED DIFFERENTIAL SIGNAL," and filed on Feb. 27, 2019. The contents of that application are hereby incorporated by reference in their entirety.

FIELD OF THE INVENTION

The present invention relates to connectors for computer systems and more specifically, to expansion card interfaces within computer systems for high-frequency signals.

BACKGROUND

Expansion cards and other add-on cards can have interfaces, hereinafter expansion card interfaces, with golden fingers. These expansion card interfaces are used extensively in computer systems. For example, many expansion cards (daughter cards) use expansion card interfaces with golden fingers for connecting to a main board (motherboard) of a computer system. One specific type of connector that can receive an expansion card is a peripheral component interconnect express (PCIe) connector.

FIG. 1 illustrates a connection of an expansion card 100 with a conventional connector 102, such as a PCIe connector. The connector 102 includes connector pins 104 within a slot 106 that is defined by a housing 108. The connector pins 104 contact both sides of the expansion card 100, when the expansion card 100 is inserted into the slot 106. At least one side of the expansion card 100 includes electrical pads (FIG. 2), which are commonly referred to as golden fingers. The connector pins 104 contact the electrical pads, which forms an electrical connection between the expansion card 100 and the connector 102.

FIG. 2 illustrates an interface region 200 of a conventional expansion card, such as the expansion card 100 of FIG. 1. The interface region 200 includes four electrical pads, including two signal pads 202 and two ground pads 204 (collectively referred to as "contact pads" or "pads"). The signal pads 202 and the ground pads 204 are formed on a substrate 206 of a printed circuit board (PCB) having the interface region 200. The signal pads 202 and the ground pads 204 extend to the edge 206a of the substrate 206. The signal pads 202 carry one or more signals to and from the electrical circuit 205 on the printed circuit board and the corresponding connector (e.g., connector 102 of FIG. 1), within which the interface region 200 is inserted.

Connector pins (e.g., connector pins 104 of FIG. 1) of the connector (e.g., connector 102 of FIG. 1) are configured to contact the signal pads 202 and the ground pads 204 at contact points 208 (represented by the dotted circles). Based on the lengths of the signal pads 202 and the ground pads 204, and the depth of the corresponding connector (e.g., connector 102 of FIG. 1), the contact points 208 are generally in the middle 214 of the signal pads 202 and the ground pads 204 (represented approximately by the dotted line).

The lengths of the signal pads 202 and the ground pads 204, from generally the contact points 208 to the distal ends 202a and 204a, form signal stubs 210 and ground stubs 212, respectively (collectively referred to as contact stubs or stubs). The lengths of the signal pads 202 from generally the contact points 208 to the proximal ends 202b, opposite from the distal ends 202a, form signal electrical contacts 216. The lengths of the ground pads 204 from generally the contact points 208 to the proximal ends 204b, opposite from the distal ends 204a, form ground electrical contacts 218. The signal electrical contacts 216 and the ground electrical contacts 218 are collectively referred to as electrical contacts.

The signal stubs 210, the ground stubs 212, or both can cause reflections in the signal electrical contacts 216, the ground electrical contacts 218, or both; which can reduce signal margins. For connections of high-frequency signals using the conventional expansion card interface formed of the interface region 200, the longer the signal stubs 210, the ground stubs 212, or both; the greater the reduction in the signal margin.

FIG. 3 illustrates a plot 300 of signal loss measurements for different lengths of signal stubs 210 and ground stubs 212 as a function of signal frequency. The line 302 represents an 80 millimeter (mm) stub; the line 304 represents a 110 mm stub; and the line 306 represents a 160 mm stub. As shown, the increase of signal loss measurements coincides with the increase in the length of the contact stubs.

Accordingly, there is a need for an expansion card interface for use in connections of high-frequency signals that does not suffer from a reduction in signal margin.

SUMMARY

According to one embodiment, an expansion card interface for a printed circuit board is disclosed. The expansion card interface includes a substrate having an edge and a plurality of pins. The plurality of pins includes a plurality of signal pins configured to communicate one or more signals to and from the printed circuit board, and a plurality of ground pins adjacent to the plurality of signal pins configured to provide a ground. The expansion card interface has at least one signal pin of the plurality of signal pins extending closer to the edge of the substrate than at least one ground pin of the plurality of ground pins.

According to aspects of the embodiment, each signal pin of the plurality of signal pins extends closer to the edge of the substrate than the at least one ground pin. Alternatively, each signal pin of the plurality of signal pins extends closer to the edge of the substrate than each ground pin of the plurality of ground pins. The at least one signal pin can be configured to communicate a high-frequency signal. The high-frequency signal can have a frequency of, for example, 4 to 10 gigahertz, or higher. The plurality of signal pins can extend to the edge of the substrate. The plurality of ground pins can extend to about half the length of the plurality of signal pins. The proximal ends of the plurality of signal pins and the plurality of ground pins can be aligned. The proximal ends of the plurality of signal pins and the plurality of ground pins can be offset. Distal ends of the plurality of signal pins can be aligned. Distal ends of the plurality of signal pins can be offset. Distal ends of the plurality of ground pins can be aligned. Distal ends of the plurality of ground pins can be offset. The plurality of ground pins extends parallel to the plurality of signal pins.

According to another embodiment, an expansion card interface for a printed circuit board is disclosed. The expansion card interface includes a substrate having an edge and a plurality of pins. The plurality of pins includes a plurality of signal pins configured to communicate one or more signals to and from the printed circuit board. The plurality of signal pins extends to the edge of the substrate. The plurality of pins further includes a plurality of ground pins adjacent to the plurality of signal pins configured to provide a ground for the plurality of signal pins. The plurality of ground pins extends half the length of the plurality of signal pins from proximal ends of the plurality of signal pins.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments and are, therefore, not to be considered as limitations on the scope of the various embodiments or claims.

DETAILED DESCRIPTION

Figure 1:
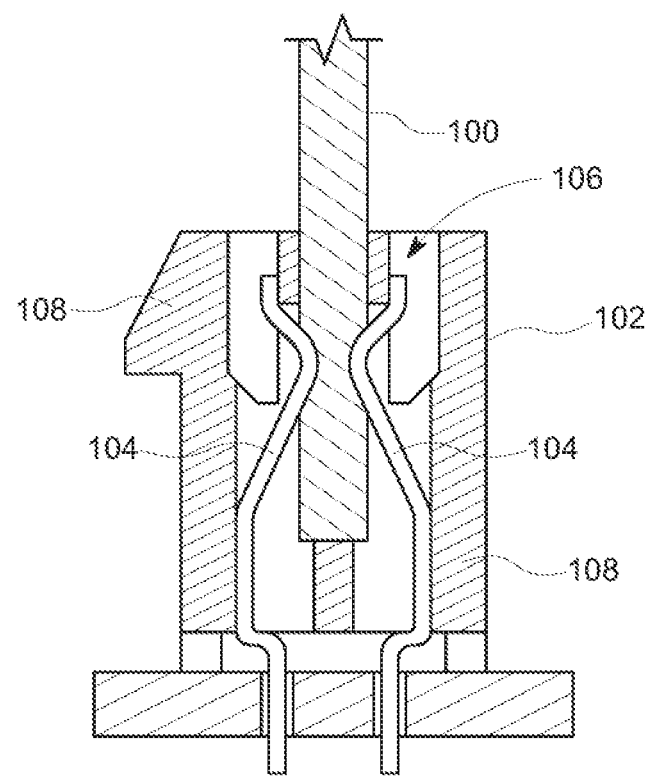
FIG. 1 illustrates a cross section of a conventional expansion card inserted into a connector.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

Figure 2:
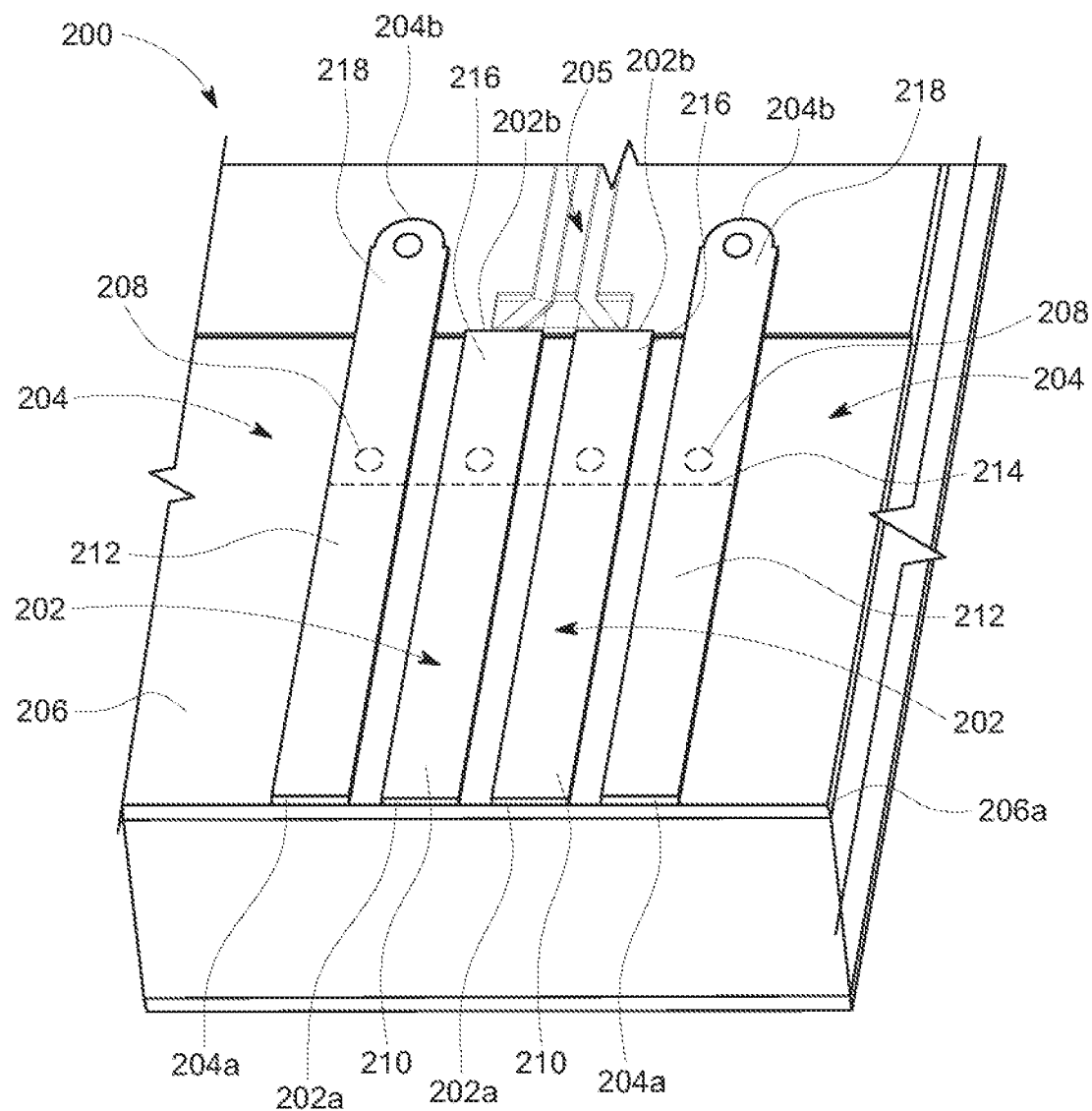
FIG. 2 illustrates an interface region of a conventional expansion card.
Figure 3:
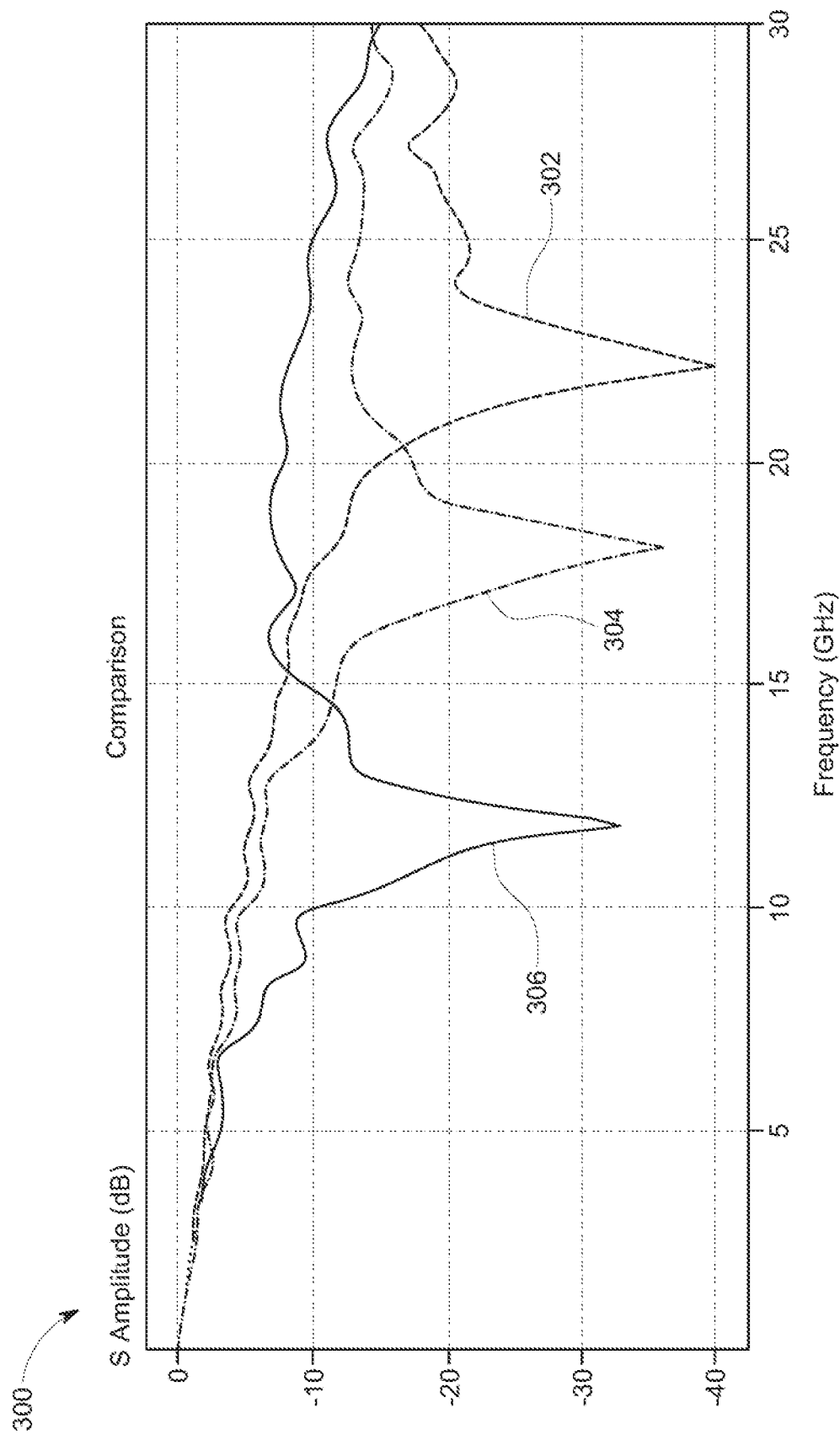
FIG. 3 illustrates signal loss measurements for different lengths of contact stubs of golden fingers of a conventional expansion card interface for a PCIe connector as a function of signal frequency.

For connections of high-frequency signals using a conventional expansion card interface (FIG. 2) and particularly for differential signals; the longer the golden fingers of the expansion card interface, the longer the contact stub and the greater the reduction in the signal margin. For example, FIG. 3 illustrates a plot 300 of signal loss measurements for different lengths of contact stubs as a function of signal frequency. Specifically, the dashed line represents an 80 millimeter (mm) contact stub; the dashed-dot line represents a 110 mm contact stub; and the dotted line represents a 160 mm contact stub. Signal loss measurements increase with the increase in length of the contact stub.

To solve the above-identified issue of the reduction in signal margin, the lengths, or positions, or both of the ground pins in an expansion card interface are modified so that the ground pins are not adjacent to at least portions of the signal pins. The modification reduces interference generated by the ground pins. The reduction in the interference reduces the loss in signal margin. Moreover, the modification of the ground pins does not materially change the processes used in forming the golden fingers, e.g., the ground pins and the signal pins. For example, because the ground pins are all shorted within the PCB of the expansion card interface, the shorted ground pins can still be plated when any ground node in the PCB contacts with a plating brush.

Figure 4:
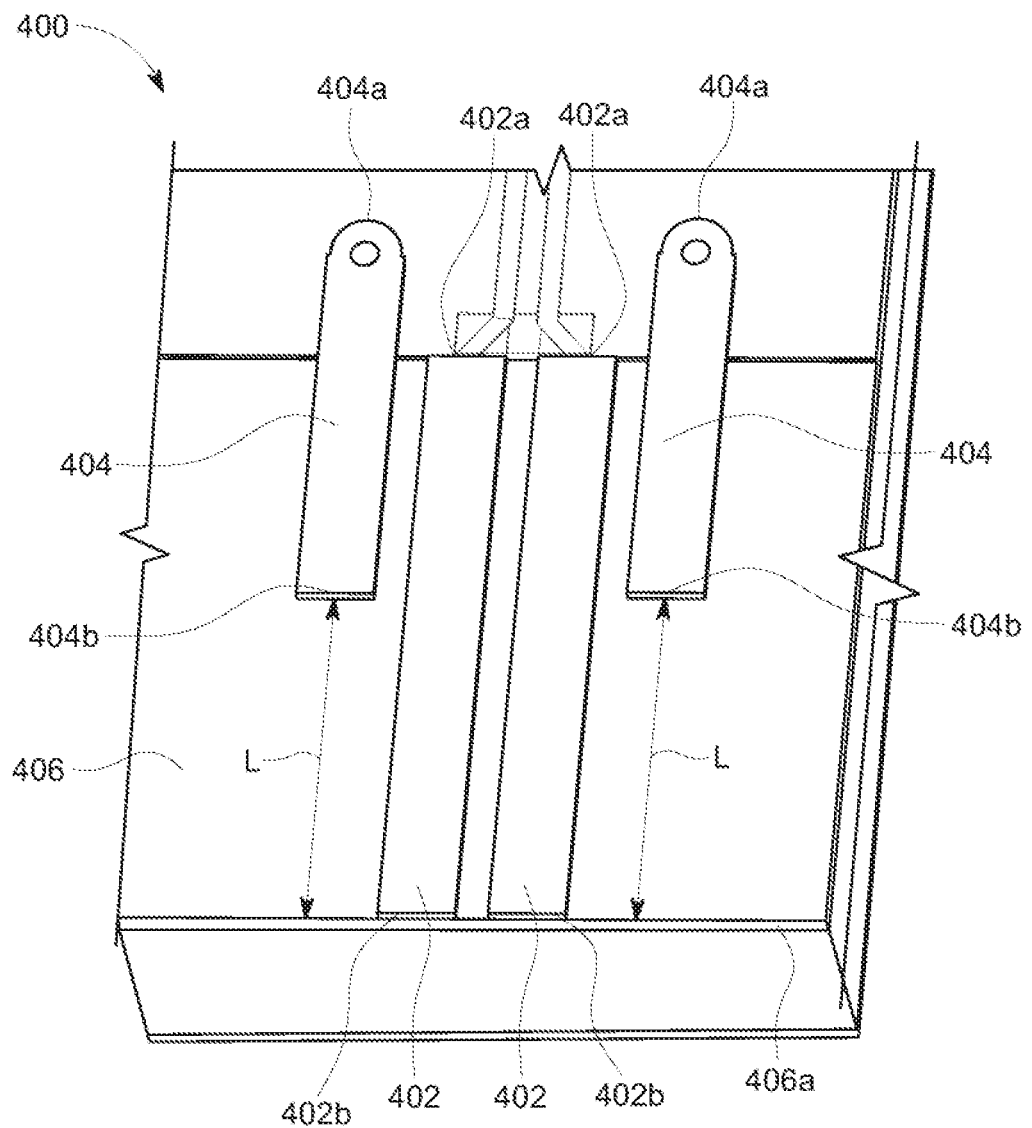
FIG. 4 illustrates an interface region of an expansion card, according to aspects of the present disclosure.

FIG. 4 illustrates an interface region 400 of an expansion card, according to aspects of the present disclosure. The interface region 400 includes four golden fingers, which are two signal pins 402 and two ground pins 404. Although only two signal pins 402 and two ground pins 404 are shown in FIG. 4, the interface region 400 can have more signal pins 402 and more ground pins 404. Thus, the two signal pins 402 and the two ground pins 404 are shown for convenience only.

The signal pins 402 and the ground pins 404 are golden fingers on a substrate 406 of a printed circuit board. The signal pins 402 and the ground pins 404 extend parallel to each other towards the edge 406a of the substrate 406. The signal pins 402 carry one or more signals to and from the interface region 400 and the corresponding slot (not shown) of the connector within which the interface region 400 is configured to be inserted. The ground pins 404 establish the ground between the interface region 400 and the corresponding slot (not shown). The signal pins 402 have proximal ends 402a and distal ends 402b. Similarly, the ground pins 404 have proximal ends 404a and distal ends 402b.

As illustrated in FIG. 4, the ground pins 404 do not extend the entire lengths of the signal pins 402. Instead, the ground pins 404 extend relative to the signal pins 402 so that the ground pins 404 are not adjacent to a length L of the signal pins 402. The lengths of the ground pins 404 can be such that the ground pins 404 are long enough to be electrically connected to the connector pins (e.g., connector pins 104 of FIG. 1) to ground the interface region 400 with the connector (e.g., connector 102 of FIG. 1). Moreover, if not all of the ground pins 404 need to make an electrical connection with a corresponding connector pin (FIG. 1), such ground pins 404 can be even shorter to further reduce their effect on the signal margin.

The lack of adjacent ground pins 404 for the length L of the signal pins 402 results in increased impedance and reduces the amount of reflection. The less reflection reduces the reduction in the single margin that conventional expansion card interfaces experience, particularly for high-frequency signals, such as signals with frequencies of 4 to 10 GHz, or higher, including signals with frequencies at or greater than approximately 4 GHz, 5 GHz, 6 GHz, 7 GHz, 8 GHz, 9 GHz, and/or 10 GHz.

In one or more embodiments, only one of the signal pins 402 may have a length L that is not adjacent to at least one of the ground pins 404. For example, if the signal pins 402 are configured to communicate different frequency signals, only the signal pin 402 configured to communicate the higher-frequency signal may have a length L that is not adjacent to an adjacent ground pin 404. The other signal pins 402 may have an adjacent ground pin 404 along its entire length.

In one or more embodiments, all of the signal pins 402 may have a length L relative to only one ground pin 404 and not all of the ground pins 404. For example, only one of the ground pins 404 may be shorter to provide of the length L of the signal pins 402, such as the ground pin 404 immediately adjacent to the signal pins 402. The other ground pins 404 may have the same length as the signal pins 402, if they are not immediately adjacent to the signal pins 402.

In one or more embodiments, and as illustrated in FIG. 4, the distal ends 402b of the signal pins 402 are at the edge 406a of the substrate 406. In contrast, the distal ends 404b of the ground pins 404 are not at the edge 406a of the substrate 406. This accounts for the length L of the signal pins 402 not being adjacent to ground pins 404. However, in one or more alternative embodiments, the distal ends 402b of the signal pins 402 may not be at the edge 406a of the substrate 406. Instead, the distal ends 402b of the signal pins 402 may be close enough to the edge 406a so that the signal pins 402 can still make a connection to connector pins of a corresponding slot (not shown), and while still accounting for the length L relative to the ground pins 404.

In one or more embodiments, and as illustrated in FIG. 4, the signal pins 402 can be longer than the ground pins 404. However, in one or more embodiments, the ground pins 404 can be the same length as the signal pins 402; or the ground pins 404 may be longer than the signal pins 402, while still accounting for the length L relative to the ground pins 404. The ground pins 404 may be the same length or longer than the signal pins 402—while still accounting for the length L—because the proximal ends 402a of the signal pins 402 and the proximal ends 404a of the ground pins 404 can be offset (i.e., not aligned). For example, the proximal ends 404a of the ground pins 404 in FIG. 4 are farther from the edge 406a than the proximal ends 402a of the signal pins 402. In one or more embodiments, the proximal ends 404a of the ground pins 404 can be closer to the edge 406a than the proximal ends 402a of the signal pins 402 if the ground pins 404 are shorter than the signal pins 402.

In one or more embodiments, the distal ends 402b of the signal pins 402 may be offset (i.e., not aligned). For example, the distal end of one signal pin 402 may be at the edge 406a of the substrate 406, and the distal end of another signal pin 402 may not be at the edge 406a of the substrate 406. However, the length L (at a minimum) may still be satisfied for both signal pins 402 based on the locations of the distal ends 404b of the adjacent ground pins 404.

In one or more embodiments, the proximal ends 402a of the signal pins 402 may be offset (i.e., not aligned). For example, the distal end of one signal pin 402 may be at the edge 406a of the substrate 406, and the distal end of another signal pin 402 may not be at the edge 406a of the substrate 406. However, the length L (at a minimum) may still be satisfied for both signal pins 402 based on the locations of the distal ends 404b of the adjacent ground pins 404.

In one or more embodiments, the proximal ends 404a, the distal ends 404b, or both, of the ground pins 404 can be offset (i.e., not aligned)

Figure 5:
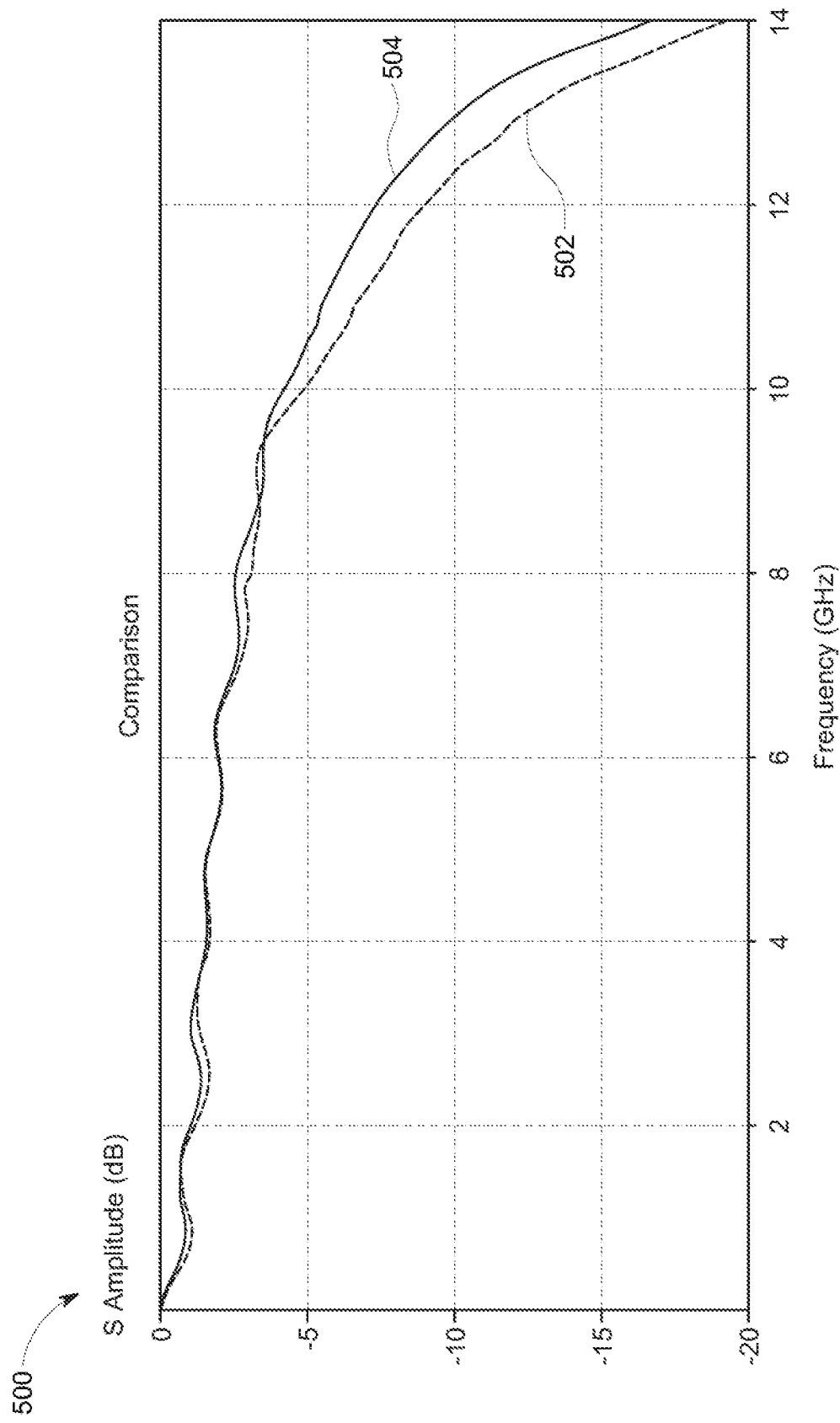
FIG. 5 illustrates signal loss measurements comparing the golden finger structures of FIGS. 2 and 4, according to aspects of the present disclosure.

FIG. 5 illustrates a plot 500 of signal loss measurements of the interface region 200 (FIG. 2), versus the interface region 400 (FIG. 4), according to aspects of the present disclosure. Specifically, the line 502 illustrates the signal loss measurements of the interface region 200, and the line 504 illustrates the signal loss measurements of the interface region 400. The plot 500 shows about a 0.6 decibel (dB) improvement of the interface region 400 over the interface region 200.

As an additional example of the benefit of the present disclosure, two expansion cards were formed based on the configurations of the interface region 200 (FIG. 2) and the interface region 400 (FIG. 4). Margin tests were performed to compare the performance of the two expansion cards. Table 1 below includes the margin test results of the expansion sion card based on the conventional configuration of the interface region 200 (FIG. 2).

TABLE 1

| Lane Number | Right Margin (UI) | Left Margin (UI) | Total Margin (UI) | Pass/Fail |
|---|---|---|---|---|
| 0 | 0.24 | −0.22 | 0.46 | Pass |
| 1 | 0.04 | −0.17 | 0.22 | Fail |
| 2 | 0.22 | −0.17 | 0.29 | Pass |
| 3 | 0.20 | −0.17 | 0.37 | Pass |
| 4 | 0.20 | −0.13 | 0.33 | Pass |
| 5 | 0.24 | −0.17 | 0.41 | Pass |
| 6 | 0.20 | −0.15 | 0.35 | Pass |
| 7 | 0.28 | −0.13 | 0.41 | Pass |
| 8 | 0.26 | −0.13 | 0.39 | Pass |
| 9 | 0.09 | −0.17 | 0.26 | Fail |
| 10 | 0.17 | −0.13 | 0.30 | Pass |
| 11 | 0.11 | −0.13 | 0.24 | Fail |
| 12 | 0.26 | −0.15 | 0.41 | Pass |
| 13 | 0.30 | −0.15 | 0.46 | Pass |
| 14 | 0.26 | −0.02 | 0.28 | Fail |
| 15 | 0.37 | −0.11 | 0.48 | Pass |

Table 2 below lists the margin test results of the expansion card based on the concept of the present disclosure and the interface region 400 (FIG. 4).

TABLE 2

| Lane Number | Right Margin (UI) | Left Margin (UI) | Total Margin (UI) | Pass/Fail |
|---|---|---|---|---|
| 0 | 0.24 | −0.17 | 0.41 | Pass |
| 1 | 0.33 | −0.09 | 0.41 | Pass |
| 2 | 0.35 | −0.15 | 0.50 | Pass |
| 3 | 0.28 | −0.13 | 0.41 | Pass |
| 4 | 0.24 | −0.22 | 0.46 | Pass |
| 5 | 0.17 | −0.2 | 0.37 | Pass |
| 6 | 0.26 | −0.15 | 0.41 | Pass |
| 7 | 0.28 | −0.13 | 0.41 | Pass |

TABLE 2-continued

| Lane Number | Right Margin (UI) | Left Margin (UI) | Total Margin (UI) | Pass/Fail |
|---|---|---|---|---|
| 8 | 0.20 | −0.17 | 0.37 | Pass |
| 9 | 0.26 | −0.17 | 0.43 | Pass |
| 10 | 0.28 | −0.15 | 0.43 | Pass |
| 11 | 0.22 | −0.15 | 0.37 | Pass |
| 12 | 0.28 | −0.13 | 0.41 | Pass |
| 13 | 0.17 | −0.22 | 0.39 | Pass |
| 14 | 0.20 | −0.11 | 0.30 | Pass |
| 15 | 0.28 | −0.15 | 0.43 | Pass |

The units shown in the test results of Tables 1 and 2 are Unit Interval (UI), which is a normalized measure of signal bit width. The pass criterion is that the signal margin should be greater than 0.30 UI for the right margin added to the left margin. The left margin means the distance from the center point to the left hand side of signal boundary. The right margin means the distance from the center point to the right hand side of signal boundary. As shown by a comparison between the data in Table 1 versus the data in Table 2, an expansion card with the interface region 400 (FIG. 4) and a length L of signal pins 402 not adjacent to ground pins 404 results in an improvement over the conventional expansion card interface based on the interface region 200 (FIG. 2).

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An expansion card comprising:
a printed circuit board formed on a substrate having an edge; and
an interface formed on the substrate, the interface including:
a plurality of signal pins connected to the printed circuit board to communicate one or more signals to and from the printed circuit board; and
a plurality of ground pins connected to the printed circuit board to provide a ground for the printed circuit board,
wherein each signal pin of the plurality of signal pins extends to and is in direct contact with the edge of the substrate,
wherein the plurality of ground pins extends up to half the length of the plurality of signal pins, and
wherein the plurality of signal pins is configured to communicate a high-frequency signal having a frequency of 4 to 10 gigahertz.

2. The expansion card of claim 1, wherein proximal ends of the plurality of signal pins and the plurality of ground pins are aligned.

3. The expansion card of claim 1, wherein proximal ends of the plurality of signal pins and the plurality of ground pins are offset.

4. The expansion card of claim 1, wherein distal ends of the plurality of ground pins are aligned.

5. The expansion card of claim 1, wherein distal ends of the plurality of ground pins are offset.

6. The expansion card of claim 1, wherein the plurality of ground pins extends parallel to the plurality of signal pins.

* * * * *